United States Patent
Jami

(10) Patent No.: US 7,330,005 B2
(45) Date of Patent: Feb. 12, 2008

(54) MOTOR DRIVING CIRCUIT

(75) Inventor: Naoya Jami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/598,621

(22) PCT Filed: Mar. 10, 2005

(86) PCT No.: PCT/JP2005/004220

§ 371 (c)(1),
(2), (4) Date: Sep. 6, 2006

(87) PCT Pub. No.: WO2005/088815

PCT Pub. Date: Sep. 22, 2005

(65) Prior Publication Data

US 2007/0176637 A1    Aug. 2, 2007

(30) Foreign Application Priority Data

Mar. 11, 2004    (JP) ............................. 2004-069077

(51) Int. Cl.
*H02K 21/00* (2006.01)
*H02K 23/00* (2006.01)
*H02K 31/00* (2006.01)
*H02P 1/18* (2006.01)
*H02P 3/08* (2006.01)

(52) U.S. Cl. .................................................. 318/254

(58) Field of Classification Search ..................... None
See application file for complete search history.

(56) References Cited

U.S. PATENT DOCUMENTS

| | | | |
|---|---|---|---|
| 6,545,514 B2 * | 4/2003 | Barrow | 327/110 |
| 6,885,225 B2 * | 4/2005 | Ohmichi et al. | 327/112 |
| 2003/0102900 A1 * | 6/2003 | Barrow | 327/309 |
| 2005/0013029 A1 * | 1/2005 | Brenden | 360/46 |
| 2005/0035806 A1 * | 2/2005 | El-Sherif et al. | 327/306 |

FOREIGN PATENT DOCUMENTS

| | | |
|---|---|---|
| JP | 10-107602 | 4/1998 |
| JP | 2003-61366 | 2/2003 |

* cited by examiner

*Primary Examiner*—Lincoln Donovan
*Assistant Examiner*—Erick Glass
(74) *Attorney, Agent, or Firm*—Fish & Richardson P.C.

(57) ABSTRACT

In a motor driving circuit in which a first NMOS and a second NMOS coupled in series to the final output stage to drive a motor are driven and a common node of the source of the first NMOS and the drain of the second NMOS serves as the final output, the motor driving circuit comprises: a first PMOS and a third NMOS having a common node of drains thereof coupled to the gate of the first NMOS; a second PMOS and a fourth NMOS having a common node of drains thereof coupled to the gate of the third NMOS; one or more PMOSs having drains coupled to the gate of the third NMOS which are turned on to charge the gate capacity of the third NMOS when the final output is low and a returned off when gate capacity of the third NMOS is charged; and one or more NMOSs having drains coupled to the gate of the third NMOS which are turned on to discharge the gate capacity of the third NMOS when the final output is high and are turned off when the gate capacity of the third NMOS is discharged and is characterized in that the gate of the first NMOS is coupled to the final output through a clamp circuit and the source of the third NMOS and the gate of the third NMOS through a clamp circuit are coupled to the final output.

5 Claims, 5 Drawing Sheets

MOTOR DRIVING CIRCUIT

TECHNICAL FIELD

The present invention relates to a motor driving circuit that can drive a transistor used as a driver for a motor with a low electric power consumption and operating at high speed.

BACKGROUND ART

FIG. 4 shows a conventional motor driving circuit. A coil as a load is coupled to the outputs of transistors NMOS 101 and NMOS 102 which are provided at the final output stage of this motor driving circuit. The motor control is performed by controlling the current supplied to the coil (The motor is not shown in the drawing). The configuration of the motor driving circuit shown in FIG. 4 will be described as follows. The NMOS 101 and the NMOS 102 are drivers provided at the final output stage and a common node of the source of NMOS 101 and the drain of NMOS 102 constitutes the final output. A supply voltage 107 is coupled to the drain of NMOS 101, while an output from a common drain node of PMOS 103 and NMOS 104 is coupled to the gate of NMOS 101. Further, a logic circuit 112 is coupled to the gate of NMOS 102, and a logic circuit 110 is coupled to the gate of the PMOS 103 respectively. Here, Zener diodes 108 and 109 functioning as clamp circuits are also used for ensuring a potential difference ($V_{gS}$) between the gate and the source of NMOS 101 and a potential difference between the gate and the source of NMOS 104 until a reverse saturation current starting to be supplied respectively to the Zener diodes. At the same time, the Zener diodes are also functioning to prevent an over-voltage being applied to respective $V_{gS}$ of NMOS 101 and the NMOS 104. Finally, the gate of a PMOS 105 is coupled to a logic circuit 111 and the gate voltage of an NMOS 106 is coupled to a logic circuit 113. The final output is determined in accordance with the state of an input voltage from the logic circuits 110, 111, 112 and 113.

Now, an operation of the conventional motor driving circuit shown in FIG. 4 will be described below together with a voltage wave form diagrams of the motor driving circuit shown in FIG. 5. The wave form diagram of FIG. 5 shows, from an upper part, the low/high of the final output and the gate voltages of NMOS 101, the NMOS 102, the PMOS 103, the NMOS 104, the PMOS 105 and the NMOS 106 (that is, when the gate voltage of NMOS is high, the NMOS is turned on). In a section of (A) shown in FIG. 5, the final output is high. That is, the NMOS 101 as the driver constituting the final output stage is in on-state and the NMOS 102 is in off-state. Since the NMOS 101 is in on-state, the output from the common drain node of the PMOS 103 and the NMOS 104 is high. Consequently, the PMOS 103 is in on-state and the NMOS 104 is in off-state, that is, the gate voltage of the PMOS 103 and the NMOS 104 is low. Further, since the NMOS 104 is in off-state, the PMOS 105 is in on-state and the NMOS 106 is in a state of being tuned off. Further, in a section (B) shown in FIG. 5, the final output is low. In comparison with the section (A) in which the final output is high, the on/off states of NMOS 101, the NMOS 102, the PMOS 103, the NMOS 104, the PMOS 105 and the NMOS 106 and the states of input voltage to the gates of the respective transistors come to be the inverted states to those described in the case of the section (A).

The final output is fed back to the gate of NMOS 101 through the Zener diode 108, and to the gate of NMOS 104 through the Zener diode 109 and the source of NMOS 104 in order to control the gage voltage of NMOS 101 based on the source of NMOS 101 and the source of NMOS 104 as the references. Thus, the abnormal state of the final output can be detected by the transistor used for the motor driving circuit, on top of this, using the transistors together with the clamp circuits eliminates the need of designing the devices used for the motor with a high voltage tolerance level.

In the above-described circuit operation, as to the high/low switching of the low of the final output from the common node of NMOS 101 and the NMOS 102, the NMOS 104 needs to be switched to on from off-state to on-state. On the other hand, in order to switch the final output from Low to High, the NMOS 104 needs to be switched from on-state to off-state. Accordingly, one of the requirements of rapid reflection of the input is to the final output is to switch the NMOS 104 on and off rapidly, that is, the gate capacity and the parasitic capacity of NMOS 104 need to be charged and discharged at high speed.

Here, from Q=IT (Q: quantity of electric charge; I: current, T: time), quick electric charge of the gate capacity and the parasitic capacity of a MOS transistor can be performed by increasing the quantity of current that is supplied to the gate of the MOS transistor. In order to solve this problem, current flow amount from the drain of the PMOS 105, which is coupled to NMOS 104, needs to increase so as to improve a charging speed of the gate capacity and the parasitic capacity of NMOS 104. On the other hand, if the drain current of the drain of NMOS 106 coupled to the gate of NMOS 104 is increased, a discharging speed of the gate capacity and the parasitic capacity of NMOS 104 can be improved. Therefore, from a current equation of a MOS transistor in a saturated state $I^{\doteq}=K(V_{gs}-V_{th})^2$ (K: constant, $V_{th}$: threshold voltage of PMOS), one of the solution is to increase the drain current of the PMOS 105 so as to increase $V_{gs}$, however, since a drive operation with a low electric power consumption is desirable today, it is not preferable to increase a supply voltage 115 coupled to a source. In the above-described formula, as K is a constant proportional to the width of the gate forming the transistor, the quantity of current can be also increased by expanding the width of the gate. Further, from I=R/V in accordance with the Ohm's law, by lowering the resistance value of a resistance 114, which is coupled to the source of the PMOS 105, it is possible to increase the current from the drain of the PMOS 105.

DISCLOSURE OF THE INVENTION

Problems that the Invention is to Solve

Here, in case of the output being in low-state, the gate capacity and the parasitic capacity of NMOS 104 are charged with the drain current of the PMOS 105 so that the NMOS 104 needs to be kept turned on. However, when the size (W/L ratio) of the transistor of the PMOS 105 is changed to drive the NMOS 104 at high speed or the resistance 114 of the source side of the PMOS 105 is changed for the purpose of increasing the drain current of the PMOS 105, a quantity of the reverse saturation current flow of the Zener diode circuit 109 is increased for keeping the NMOS 104 with on-state, resulting in the generation of a current flowing in an output direction at the final output stage. Thus, a electric power consumption is increased. Further, in case of increasing the supply voltage 115 and an input signal of the gate voltage of the PMOS 105, a high speed driving operation of NMOS 104 can be realized.

However, this method is not preferable in view of the electric power consumption. This is because when the drain current of the PMOS 105 decreases, a reverse saturation current comes to decrease in the Zener diode 109 to lower a electric power consumption, however, the NMOS 104 cannot be driven at high speed. Further, the NMOS transistors 101 and 102 constituting the final output stage might be simultaneously turned on due to the delay of the input, which causes a through current flow, resulting that the electric power consumption is increased. Accordingly, there is a possibility of the device being broken.

By considering the above-described conventional circumstances, the present invention is devised to solve drawbacks contemplated in the related arts, and accordingly, it is a first object of the present invention to provide a motor driving circuit having low electric power consumption and operating at high speed. It is a second object to provide a semiconductor device having the above-described motor driving circuit. It is a third object of the present invention to provide a motor device including the above-described semiconductor device, a coil controlled by the semiconductor device and a motor in which the rotating speed of a rotor is determined by a magnetic field generated in the coil.

Means for Solving the Problems

The above-described first object can be realized by a motor driving circuit for driving a motor by driving a first NMOS and a second NMOS coupled in series to the final output stage where a common node of the source of the first NMOS and the drain of the second NMOS serves as the final output. The motor driving circuit comprises: a first PMOS and a third NMOS having a common node of drains thereof coupled to the gate of the first NMOS; a second PMOS and a fourth NMOS having a common node of drains thereof coupled to the gate of the third NMOS; one or more PMOSs having drains coupled to the gate of the third NMOS which are turned on to charge the gate capacity of the third NMOS when the final output is low and are turned off when gate capacity of the third NMOS is charged; and one or more NMOSs having drains coupled to the gate of the third NMOS which are turned on to discharge the gate capacity of the third NMOS when the final output is high and are turned off when the gate capacity of the third NMOS is discharged and is characterized in that the gate of the first NMOS is coupled to the final output through a clamp circuit and the source of the third NMOS and the gate of the third NMOS through a clamp circuit are coupled to the final output. According to this structure, a switching speed can be accelerated with low electric power consumption.

The first object can be achieved by the motor driving circuit according to claim 1, wherein the clamp circuit is a Zener diode as the invention defined in claim 2.

The first object can be also achieved by the motor driving circuit according to claim 1 or 2, characterized in that the motor driving circuit includes the first NMOS and the second NMOS as the invention defined in claim 3.

The second object can be achieved by a semiconductor device having the motor driving circuit according to any one of claims 1 to 3, as the invention defined in claim 4.

The NMOS provided in the final output stage is provided separately from a circuit part for driving the NMOS of the final output stage or provided in the same semiconductor device. Since a large quantity of current is ordinarily supplied to the NMOS in the final output stage, the circuit part for driving the NMOS of the final output stage is provided in an external part. Thus, even when an over-current is supplied to the NMOS in the final output stage, the circuit part for driving the NMOS in the final output stage hardly receives its influence.

The third object can be achieved by a motor device including the semiconductor device according to claim 4 and a motor having a coil driven by the semiconductor device, as the invention defined in claim 5.

Advantage of the Invention

The motor driving circuit can be realized in which a high speed operation can be performed with a low consumer electric power and a through current is not supplied to a transistor forming the final output state so that there is no fear that elements used for the structure may be possibly broken.

Figure 1:
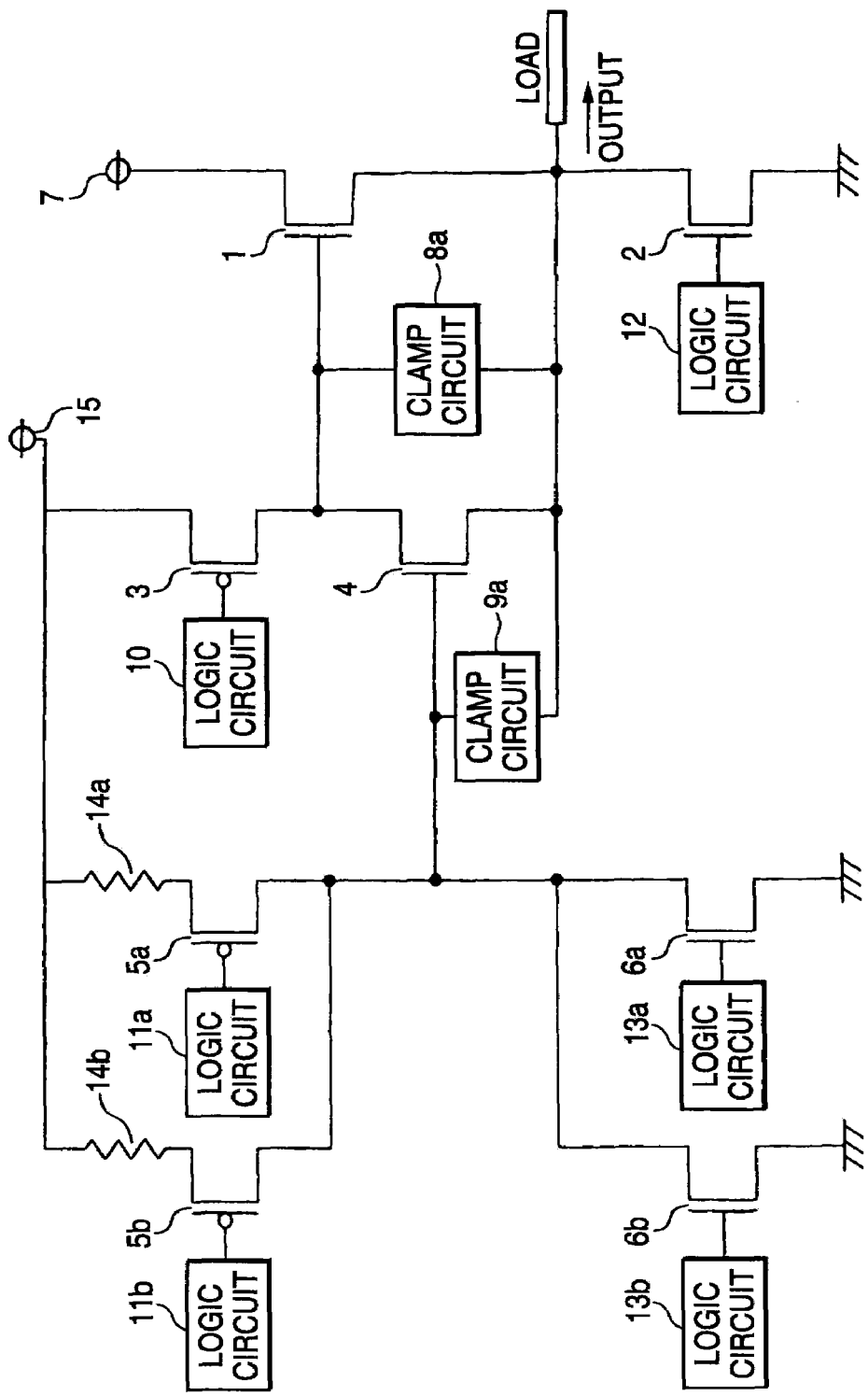
FIG. 1 is a circuit diagram of a motor driving circuit according to the present invention (first embodiment).

DESCRIPTION OF REFERENCE NUMERALS AND SIGNS 1,2,4,6,6a, 6b, 16 . . . NMOS
3,5a, 5b, 18a, 18b, 20a, 20b . . . PMOS
7, 15, 21 . . . supply voltage
8a, 9a . . . clamp circuit
8b, 9b . . . Zener diode
14a, 14b, 20am 20b . . . resistance.

BEST MODE FOR CARRYING OUT THE INVENTION

Now, the best mode for carrying out the present invention will be described below. FIG. 1 shows a motor driving circuit according to the present invention. A coil as a load is coupled to an output from an NMOS 1 and an NMOS 2 which are provided at the final output of the motor driving circuit. An electric current supplied to the coil is controlled to control a motor which is not shown in the drawing. An output at the final output stage might be within a range between a zero potential of a ground coupled to the source of NMOS 2 and a potential of a supply voltage 7 coupled to the drain of NMOS 1.

Figure 4:
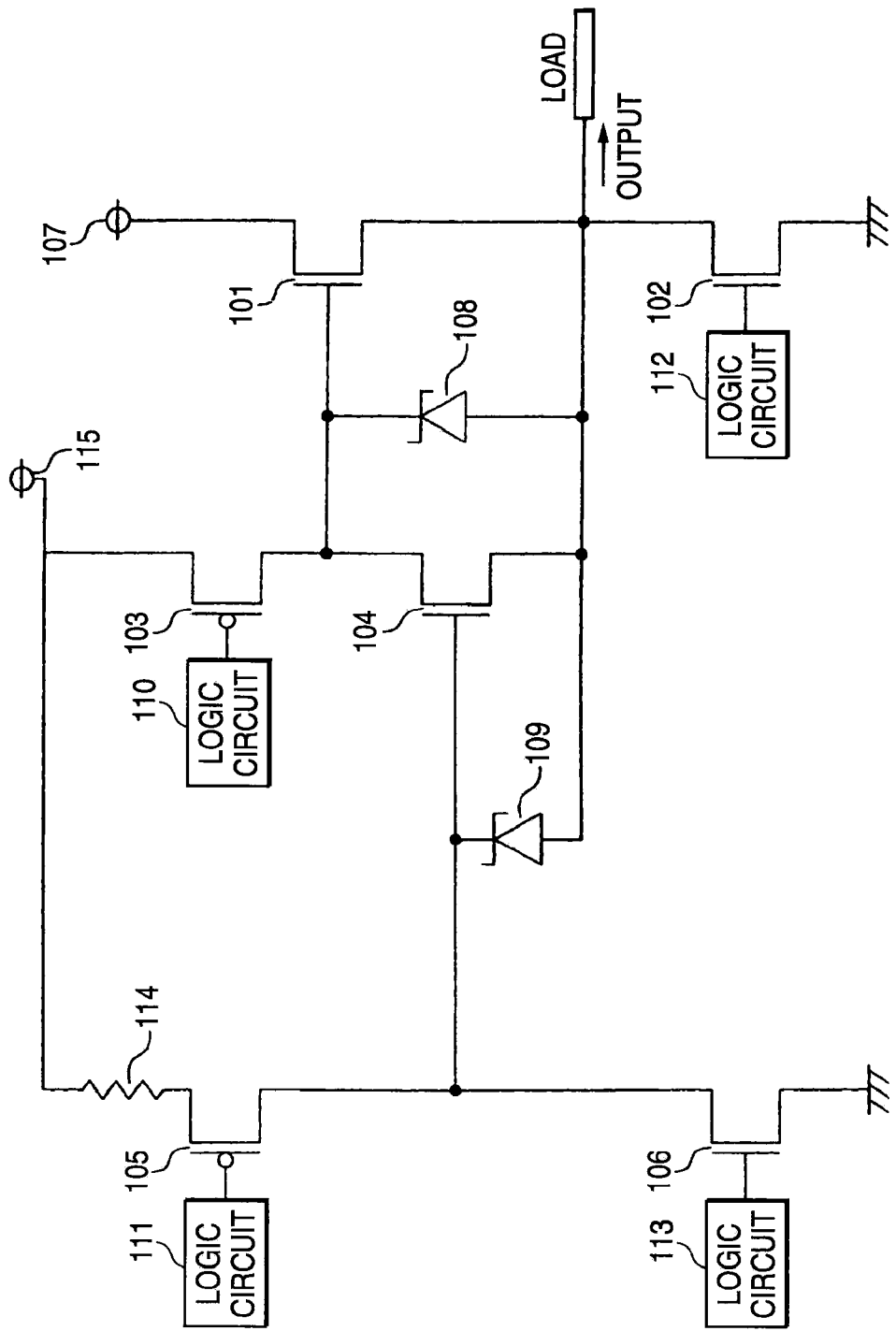
FIG. 4 is a circuit diagram of a usual motor driving circuit.
Figure 5:
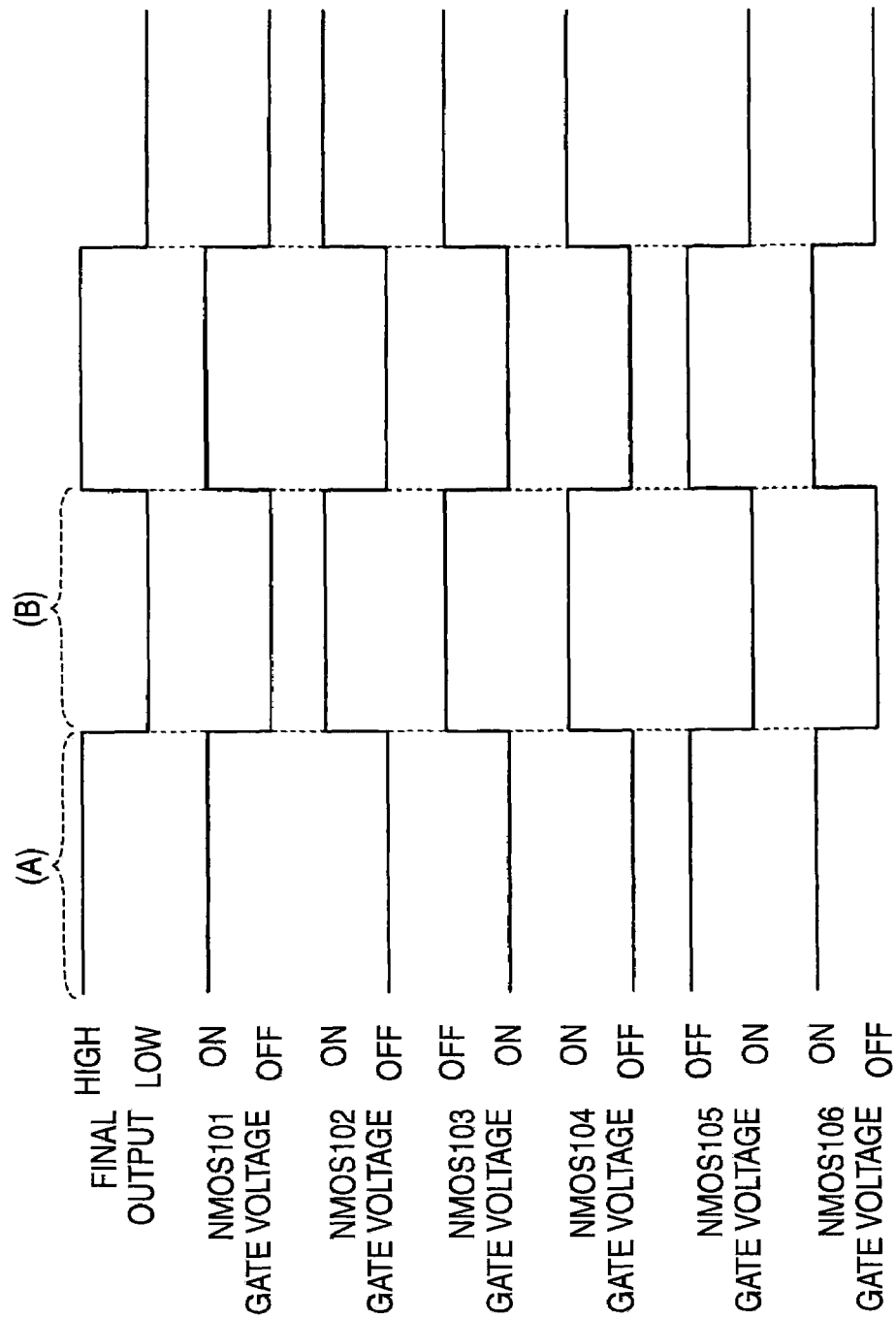
FIG. 5 is a voltage change diagram of the usual motor driving circuit.

In comparing the motor driving circuit according to the present invention shown in FIG. 1 with the conventional motor driving circuit shown in FIG. 4, a plurality of charging means and a plurality of discharging means are provided as compared with FIG. 4, where the PMOS 105 corresponds to a charging means and the NMOS 106 corresponds to a discharging means. Those means are respectively provided for charging the gate capacity and the parasitic capacity of NMOS 4, which is corresponding to the NMOS 104 in FIG. 4, whose drain is coupled to the gate of NMOS 1 coupled in series to the final output stage, which is corresponding to the NMOS 101 in FIG. 4. Now, the structure of the motor driving circuit according to the present invention will be described below.

In FIG. 1, the final output stage includes the NMOS 1 and the NMOS 2. A common node of the source of NMOS 1 and the drain of NMOS 2 constitutes the final output. A common node of the drain of a PMOS 3 and the drain of NMOS 4 is coupled to the gate of NMOS 1. A logic circuit 12 is coupled to the gate of NMOS 2, and a logic circuit 10 is coupled to the gate of the PMOS 3. A clamp circuit 8*a* is a protecting the circuit for preventing $V_{gs}$ of NMOS 1 from exceeding a predetermined level, where a Zener diode or a diode might be employed. A clamp circuit 9*a* is provided between the gate and the source of NMOS 4 for the same purpose. A common node of the drains of a PMOS 5*a* and a PMOS 5*b*, and a common node of the drains of an NMOS 6*a* and an NMOS 6*b*, are coupled to the gate of NMOS 4. The gate capacity and the parasitic capacity of NMOS 4 are charged by the drain current of the PMOS 5*a* and the PMOS 5*b*, and discharged by the drain current of NMOS 6*a* and the NMOS 6*b*. A logic circuit 11*a* is coupled to the gate of the PMOS 5*a*. Further, to the source of the PMOS 5*a*, a supply voltage 15 is coupled through a resistance 14*a*, to the gate of the PMOS 5*b*, a logic circuit 11*b* is coupled, to the source of the PMOS 5*b*, the supply voltage 15 is coupled through a resistance 14*b*, to the gate of NMOS 6*a*, a logic circuit 13*a* is coupled, and to the gate of NMOS 6*b*, a logic circuit 13*b* is coupled where the sources of NMOS 6*a* and the NMOS 6*b* are respectively grounded.

The final output is fed back to the gate of NMOS 1 through the clamp circuit 8*a*, and fed back to the gate of NMOS 4 through the source of NMOS 4 and the clamp circuit 9. This is because it is possible to control the gage voltage of NMOS 1 in accordance with the source potential of NMOS 1 and the NMOS 4 which are used for reference voltages. Thus, the abnormal state of the final output can be detected by the transistors that are used for the motor driving circuit, using said transistors together with the clamping circuits can prevent the devices used for the motor drive circuit from being applied a voltage that is exceeding a withstanding voltage.

Figure 2:
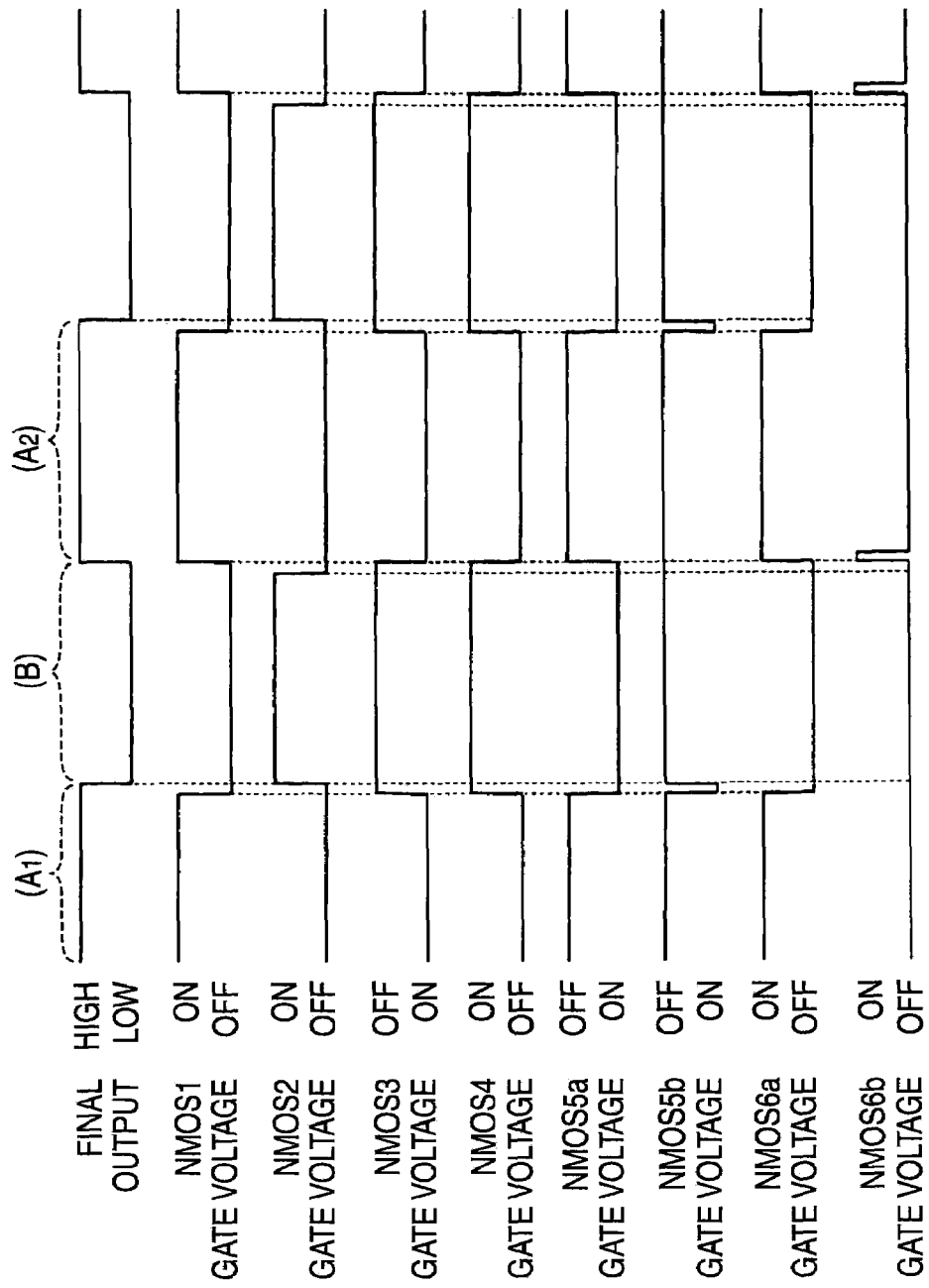
FIG. 2 is a voltage change diagram of the motor driving circuit according to the present invention.

Now, an operation of the motor driving circuit according to the present invention shown in FIG. 1 will be described below by employing a voltage wave form diagram of the motor driving circuit according to the present invention shown in FIG. 2. The wave form diagram of FIG. 2 shows, from an upper part, the states of low/high of the final output and the gate voltages of NMOS 1, the NMOS 2, the PMOS 3, the NMOS 4, the PMOS 5*a*, the PMOS 5*b*, the NMOS 6*a* and the NMOS 6*b* (that is, when the gate voltage of NMOS is high, the NMOS is turned on). In a section of ($A_1$) shown in FIG. 2, the final output is high, and the NMOS 1 as a driver constituting the final output stage is held in a on-state except a moment immediately before the section of ($A_1$) is changed to a section shown in (B), in other words, a section immediately before the final output is switched from the high to the low. On the other hand, the NMOS 2 is always held in off-state in the same section (A1). When the NMOS 1 is turned on, an output from the common node of the drains of the PMOS3 and the NMOS 4 is high, so that the PMOS 3 is on-state and the NMOS 4 is off-state. When the NMOS 4 is turned off, the PMOS 5*a* and the PMOS 5*b* are off-states. On the other hand, as for the NMOS 6*a* and the NMOS 6*b* as discharging means of NMOS 4, the NMOS 6*a* is in on-state except a section immediately before the change from the section ($A_1$) to the section (B) and the NMOS 6*b* is always in a off-state. In this operation, discharging the gate capacity and the parasitic capacity in order to maintain the final output in a high level, in other words, in order to maintain the NMOS 4 in a off-state, this is carried out only by the NMOS 6*a*. An operation of NMOS 6*b* will be described below.

At the moment immediately before the section ($A_1$) is changed to the section (B) shown in FIG. 2, that is, at the moment immediately before the final output is switched from the high to the low, the NMOS 6*a* is turned off and the PMOS 5*a* and the PMOS 5*b* are turned on. The gate capacity and the parasitic capacity of NMOS 4 are charged by two sets of the charging means. After the gate capacity and the parasitic capacity are charged, the on-state of NMOS 4 is maintained only by a voltage from the drain of the PMOS 5*a* in order to keep the final output in a low level where the PMOS 5*b* is off-state. Here, to ensure $V_{gs}$ of NMOS 4 for maintaining the NMOS 4 in a on-state, the drain current of the PMOS 5*a* is desirably at the level slightly more than a threshold of a reverse current being generated in the clamp circuit 9. Further, the drain current from the drain of the PMOS 5*b* that is turned on only when the gate capacity and the parasitic capacity of NMOS 4 are charged is determined depending on factors such as the resistance 14*b* and the supply voltage 15. Further, in FIG. 2, when the state of NMOS 4 is changed from off to on, the state of the PMOS 3 is changed from on to off at the same time. Thus, the gate voltage of NMOS 1 is determined. The NMOS 2 has a little delay to a timing of NMOS 1 for switching from on to off not to generate a through current to the NMOS 1. Then, the final output becomes a low level simultaneously with the change of NMOS 2 from off to on.

In the section of (B) shown in FIG. 2, the final output is low where the NMOS 1 is in off-state and the NMOS 2 is in on-state except a section immediately before the section of (B) is changed to a section of ($A_2$). In the section shown in (B), since the NMOS 1 is always off-state, the outputs from the PMOS 3 and the NMOS 4 are low, and the PMOS 3 is in off-state and the NMOS 4 is in on-state. Since the NMOS 4 is turned on, the charging means for the gate capacity and the parasitic capacity of NMOS 4 are activated. However, as described previously, after the NMOS 4 is turned on, $V_{gs}$ of NMOS 4 is ensured only by the PMOS 5*a*, so that only the PMOS 5*a* is in on-state. The NMOS 2 is turned off at a timing earlier than that of NMOS 1, being described later on, so that a through current by the supply voltage 7 and the NMOS 1 is not generated.

When the section of (B) is changed to the section of ($A_2$), that is, the final output is switched from the low to the high, the NMOS 1 is turned on, so that the PMOS 3 is in on-state and the NMOS 4 is in off-state. Accordingly, the discharging means for discharging the gate capacity and the parasitic capacity of NMOS 4 are activated. At this time, from the need of operating the final output at high speed, which requires discharging the gate capacity and the parasitic capacity of NMOS 4 instantaneously by activating the two discharging means of NMOS 6*a* and the NMOS 6*b*. After the parasitic capacity of NMOS 4 is discharged, the NMOS 6*b* is stopped. Even when a voltage is applied to the gate voltage to control the discharging means, any factor of consuming an electric power hardly exists except a leakage current between the gate and the source of NMOS 4. In this regards, the generation of a current in the output direction of the final output is not suppressed thereby to decrease the electric power consumption. However, due to a plurality of applying means for the gate voltage being provided, the high speed discharge of the gate capacity and the parasitic capacity of NMOS 4 can be achieved. This is especially effective when the supply voltage 15 is not a large power source sufficiently from the need of achieving a driving operation by a low voltage or when the large gate voltage of NMOS 6a and the NMOS 6b cannot be obtained from the logic circuits 13a and 13b.

In the conventional motor driving circuit, a circuit design choice must be selected from large electric power consumption for ensuring high speed characteristics, or low electric power consumption by spoiling the high speed characteristics. However, the motor driving circuit according to the present invention ensures the high speed characteristics of an output in response to an input without spoiling the low electric power consumption.

As for the continuous generation of drain current of NMOS of a ground side in the final output stage or a current in the output direction of the final output, this is inevitable thing for the motor driving circuit having the final output stage constituted only by NMOS. This is because the voltage of the gate of NMOS provided in the final output stage must be driven by referring to the source of NMOS of a power source side, which is provided in the final output stage, and for this reason, the final output is reflected to the motor driving circuit. In such a case, since the final output is coupled to the source of NMOS for discharging the NMOS at the power source side, being provided in the final output stage, the gate voltage of NMOS for turning off the NMOS at the power source side must be continuously held. Therefore, the drain current of NMOS of a ground side in the final output stage or a current in the output direction of the final output is continuously generated. As to the above-described PMOS 5b or the NMOS 6b, such as used for activating only for a predetermined period, it is possible to employ a plurality sets of charging means or discharging means.

Figure 3:
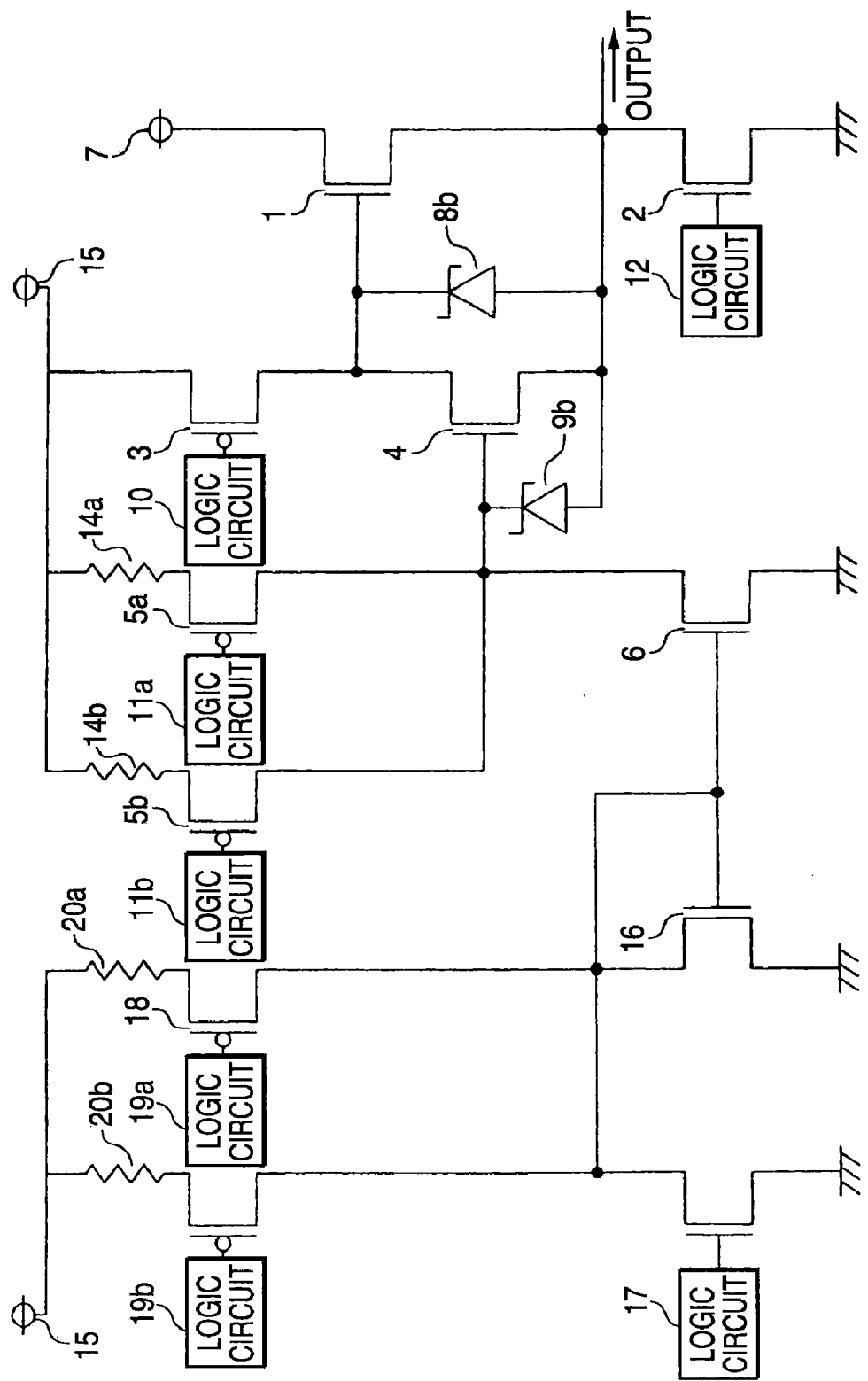
FIG. 3 shows a second embodiment of a motor driving circuit according to the present invention (second embodiment).

A second embodiment of the present invention is shown in FIG. 3. In FIG. 3, Zener diodes are used for the clamp circuits of the motor driving circuit, and the discharging means are modified in comparison of the present invention as has been shown in FIG. 1. More specifically to say, as compared with the motor driving circuit according to the present invention shown in FIG. 1, the NMOS 6b and the logic circuit 13b are removed, while provided are an NMOS 6 and an NMOS 16 mirror-coupled thereto, a PMOS 18a and a PMOS 18b coupled to the gates of NMOS 6 and the NMOS 16, logic circuits 19a and 18b, and resistances 20a and 20b. Since the characteristics of the reverse breakdown voltage of the Zener diodes are desirable for the clamp circuits, the Zener diodes are used for the clamp circuits. As the charging means for the gate capacity and the parasitic capacity of an NMOS 4, there provided a single path for a drain current of a PMOS. As a discharging means for the gate capacity and the parasitic capacity of NMOS 4, the gate voltage of the mirror-coupled NMOS is adjusted in the levels of three stages. In FIG. 3, components corresponding to those shown in FIG. 1 are designated by the same reference numerals shown in FIG. 1.

By employing the second embodiment of the motor driving circuit according to the present invention shown in FIG. 3, an inventor of this invention can reduce a time change at the output in response to an input from 1 μ second to about 0.4 μ second as compared with the motor driving circuit shown in FIG. 4, and a current in the output direction from the final output for maintaining the final output in a low level was reduced to 0.3 mA from 0.7 mA, resulting in that a switching operation at high speed and a low power consumption can be achieved.

Further, though not shown in the drawing, if the motor device including a semiconductor device having the motor driving circuit of the present invention and the motor having a coil driven by the semiconductor device are employed for an electronic device with having the motor device, such as a printer, a good operation performance can be seen since a control signal for the semiconductor device with the motor driving circuit can reach a desired rotating speed as an output of the motor device more faster than that of being performed in a conventional device.

The present invention is not limited to the above-described embodiments but any modification in design shall be within a scope of this invention such as described in claims.

The invention claimed is:

1. A motor driving circuit for driving a motor by driving a first NMOS and a second NMOS coupled in series to the final output stage where a common node of the source of the first NMOS and the drain of the second NMOS serves as the final output, said motor driving circuit comprising:
    a first PMOS and a third NMOS having a common node of drains thereof coupled to the gate of the first NMOS;
    a second PMOS and a fourth NMOS having a common node of drains thereof coupled to the gate of the third NMOS;
    one or more PMOSs having drains coupled to the gate of the third NMOS which are turned on to charge the gate capacity of the third NMOS when the final output is low and are turned off when gate capacity of the third NMOS is charged; and
    one or more NMOSs having drains coupled to the gate of the third NMOS which are turned on to discharge the gate capacity of the third NMOS when the final output is high and are turned off when the gate capacity of the third NMOS is discharged, wherein the gate of the first NMOS is coupled to the final output through a clamp circuit and the source of the third NMOS and the gate of the third NMOS through a clamp circuit are coupled to the final output.

2. A motor driving circuit according to claim 1, characterized in that the clamp circuit is a Zener diode.

3. A motor driving circuit according to claim 1 or 2, characterized in that the motor driving circuit includes the first NMOS and the second NMOS.

4. A semiconductor device having the motor driving circuit according to claims 1 or 2.

5. A motor device including the semiconductor device according to claim 4 and a motor having a coil driven by the semiconductor device.

* * * * *